United States Patent
Aubree et al.

(10) Patent No.: US 7,151,811 B2
(45) Date of Patent: Dec. 19, 2006

(54) ELECTRIC CIRCUIT FOR DECODING A TWO-PHASE ASYNCHRONOUS DATA SIGNAL AND CORRESPONDING DECODING METHOD, DEVICE FOR CONTROLLING EQUIPMENT

(75) Inventors: René Aubree, Vertou (FR); Raphaël Letendu, Nantes (FR)

(73) Assignee: Atmel Nantes SA, Nantes Cedex 3 (FR)

( * ) Notice: Subject to any disclaimer, the term of this patent is extended or adjusted under 35 U.S.C. 154(b) by 0 days.

(21) Appl. No.: 10/990,622

(22) Filed: Nov. 17, 2004

(65) Prior Publication Data

US 2005/0117671 A1 Jun. 2, 2005

(30) Foreign Application Priority Data

Nov. 21, 2003 (FR) .................................. 03 13689

(51) Int. Cl.
*H04L 7/02* (2006.01)
(52) U.S. Cl. ........................................ 375/360; 375/361
(58) Field of Classification Search ................ 375/360, 375/361, 316, 340; 370/395, 503; 327/50, 327/58, 172, 175
See application file for complete search history.

(56) References Cited

U.S. PATENT DOCUMENTS

| | | | |
|---|---|---|---|
| 4,019,153 A * | 4/1977 | Cox et al. .................... | 331/1 A |
| 4,330,862 A * | 5/1982 | Smolik ........................ | 375/316 |
| 4,502,024 A * | 2/1985 | Nishikawa et al. ......... | 332/109 |
| 5,127,023 A * | 6/1992 | Tash et al. .................. | 375/282 |
| 5,144,314 A * | 9/1992 | Malmberg et al. ........... | 342/44 |
| 5,168,511 A | 12/1992 | Boles | |
| 5,297,869 A * | 3/1994 | Benham ...................... | 375/361 |
| 5,889,820 A * | 3/1999 | Adams ....................... | 375/282 |
| 6,370,212 B1 * | 4/2002 | Nakai .......................... | 375/359 |
| 6,885,716 B1 * | 4/2005 | Zalud et al. ................ | 375/361 |
| 2002/0099451 A1 * | 7/2002 | Wang ........................... | 700/4 |
| 2003/0036807 A1 * | 2/2003 | Fosler .......................... | 700/3 |

FOREIGN PATENT DOCUMENTS

| | | |
|---|---|---|
| DE | 101 63 702 A1 | 7/2003 |
| EP | 1 347 609 A1 | 9/2003 |

OTHER PUBLICATIONS

"Biphase/NZR Decoder solves jitter problems" Horstmann, John Mar. 17, 1983. Electrical Design News, vol. 28 (1983) Mar. No. 6, Boston, MA.

* cited by examiner

*Primary Examiner*—Tesfaldet Bocure
*Assistant Examiner*—Vineeta Panwalkar
(74) *Attorney, Agent, or Firm*—Merchant & Gould P.C.

(57) ABSTRACT

This invention relates to an electronic circuit for decoding an asynchronous two-phase data signal.

According to the invention, such an electronic circuit comprises means for generating a decoding clock using a counter powered by an internal clock, and repeating cycles including incrementation of the said counter until detection of a transition in the said data signal, followed by decrementing the said counter down to zero.

20 Claims, 3 Drawing Sheets

ELECTRIC CIRCUIT FOR DECODING A TWO-PHASE ASYNCHRONOUS DATA SIGNAL AND CORRESPONDING DECODING METHOD, DEVICE FOR CONTROLLING EQUIPMENT

DOMAIN OF THE INVENTION

The domain of the invention is decoding of digital data.

More precisely, the invention relates to two-phase asynchronous data decoders, particularly for data encoded according to the Manchester code.

Even more precisely, the invention relates to synchronisation of two-phase asynchronous signal decoders.

The invention may be used in applications in all domains that use Manchester type transmissions, like the industrial control or telecommunications domain, particularly when it is desirable to have simple low cost decoders. For example, the invention may be applied to communication in the lighting domain, particularly to the DALI (Digital Addressable Lighting Interface) standard.

PRIOR ART

Manchester Encoding

Manchester encoding is a technique that has been known for many years and is applied in many domains. There are several methods for recovering the corresponding clock in a receiver, particularly use of a phase locked loop or an accurate clock.

Using a Phase Locked Loop

Decoders of frames encoded using the Manchester principle usually require the use of a Phase-Locked Loop (PLL) for synchronisation. According to this principle, the phase of the output signal is locked onto the phase of the input signal, which forces the output signal frequency to lock onto the input signal frequency, enabling frequency slaving and therefore synchronisation.

One major disadvantage of this technique in prior art is that the first transmitted data are lost during the phase locking step that enables synchronisation.

Another disadvantage of this technique is that it is expensive and relatively complex to implement, particularly due to the presence of a phase locked loop.

Use of an Accurate Clock:

For other remote transmission systems, an accurate clock has to be used in order to reliably decode received data.

One major disadvantage of this technique is that it makes it necessary for the receiver to know the transmission rate (or baud rate).

It also requires a very accurate local clock, both at the transmitter and at the receiver, which makes this technique more expensive and complex to implement.

Purposes of the Invention

One particular purpose of the invention is to overcome these disadvantages according to prior art.

More precisely, one purpose of the invention is to provide a decoding technique for a two-phase asynchronous data signal used to simply and efficiently recover a decoding clock, without the need for a phase locked loop or an accurate clock.

Another purpose of the invention is to provide such a technique that enables a receiver to automatically adapt to the data transmission speed without any prior knowledge of this speed.

Yet another purpose of the invention is to generate the decoding clock simply and inexpensively.

Another purpose of the invention is to use such a decoding technique that is particularly robust.

Essential Characteristics of the Invention

These purposes, and others that will appear later, are achieved using an electronic circuit for decoding an asynchronous two-phase data signal.

According to the invention, this type of circuit comprises means for generating a decoding clock using a counter powered by an internal clock, and repeating cycles including incrementation of the counter until detection of a transition in the data signal, followed by decrementing the counter down to zero.

Thus, the invention relates to an electronic decoding circuit that retrieves transmitted data with their transmission clock at the output using a simple counter without the need for an accurate internal clock.

This type of circuit will automatically adapt to the data transmission speed, without the need for precise knowledge of the local clock.

The count value at the output from the counter can then be seen like a sawtooth signal, the peaks of each of the teeth corresponding to transitions in the data signal. The decoding clock and decoded data can be retrieved from these transitions.

Thus, the invention is particularly efficient and is not very complex and is based on a new and inventive approach of the decoding of the two-phase asynchronous frame using a simple counter.

Preferably, the decoding clock is generated by taking into account each peak of a signal representative of the contents of the counter.

In particular, each peak is used to locate a transition that transports the value of a bit of the data signal.

In this case, the direction (up or down) of each transition will be analysed to decode the value of a bit.

In decoding the direction of the transition, the circuit can both determine the value of a bit of the data signal and reconstitute a clock in order to put the decoded data in parallel.

According to one advantageous embodiment, the electronic circuit comprises at least one register for memorising the contents of the counter when a transition is detected in the data signal.

This register improves the robustness of the electronic circuit according to the invention by comparing the output from the counter with the value stored in this register.

Preferably, the electronic circuit comprises initialisation means which, during the first falling front (down direction), activate incrementation of the counter, the counter being forced to zero before starting.

Advantageously, the electronic circuit comprises windowing means limiting the detection of a transition on predetermined intervals.

In this case, each of the predetermined intervals covers approximately 50% of a binary time and is centred on each of the transitions.

In this case, it is considered that a binary time corresponds to the duration (or width) of a bit.

In particular, the predetermined interval is controlled by a first comparator fed by the output from the memory register divided by two, and by the counter.

Thus, when the value of the counter is greater than the value of the memory register divided by two, a front detection authorisation window is created corresponding to this predetermined interval.

According to another advantageous aspect of the invention, the electronic circuit comprises means of detecting interruption of the data signal.

In particular, these interruption detection means include a second comparator feed by the output from the memory register multiplied by two, and by the counter.

Thus, it can be determined whether or not the transmission is interrupted, or whether or not data are being sent, by checking that transitions are still received.

The robustness of the system is thus improved by reducing the probability of false detection and by preventing detection on inter-bit fronts when consecutive bits have the same value using the first comparator, and/or detecting transmission absences using the second comparator.

Preferably, the electronic circuit comprises means for rejecting interferences (also called parasites) on the data signal.

In particular, these rejection means include a digital filter supplied by the data signal and controlled by the internal clock.

In particular, these rejection means may use at least three successive samples to decide on whether or not a transition exists.

These rejection means enable the decoder to avoid confusion between an interference and a transition.

Advantageously, the internal clock has a frequency at least 16 times greater than the data signal rate, which enable to put data into parallel at the output from the decoder.

According to one advantageous embodiment of the invention, the data signal is encoded using Manchester encoding.

Thus, a transition type coding is used in which the bits are encoded by transitions rather than by states.

Preferably, the data signal is organised into successive frames each beginning with a start bit.

According to one advantageous embodiment, the electronic circuit can receive and decode a sequence comprising an undefined number of data.

Thus, the circuit automatically adapts to each sequence that it receives, even if the sequence length varies during the transmission.

The invention also relates to a decoding method for a two-phase asynchronous data frame comprising steps to generate a decoding clock using a counter with an input supplied by an internal clock, and repeating cycles consisting of incrementing the counter until a transition in the data signal is detected, and then decrementing the counter down to zero.

The invention also relates to devices for controlling at least one item of equipment implementing at least one electronic circuit like that described above.

In particular, the equipment controlled by these control devices may be a lighting equipment.

LIST OF FIGURES

Other special features and advantages of the invention will become clearer after reading the following description of a preferred embodiment, given as a simple illustrative and non-limitative example, and the appended figures, wherein.

Figure 1:
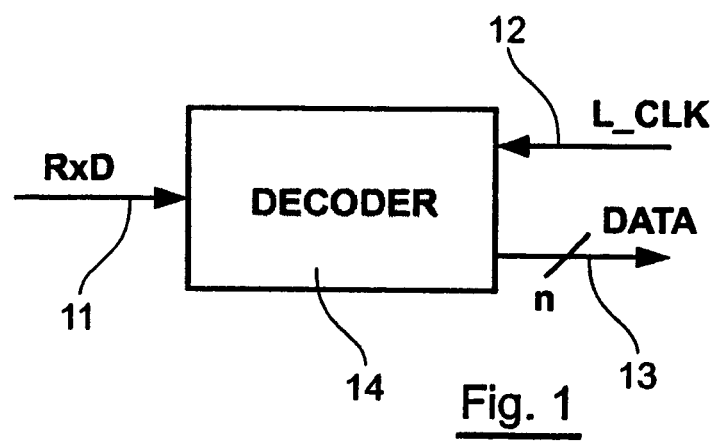
FIG. 1 shows a general diagram of a decoder of a signal encoded using the Manchester principle.
Figure 3:
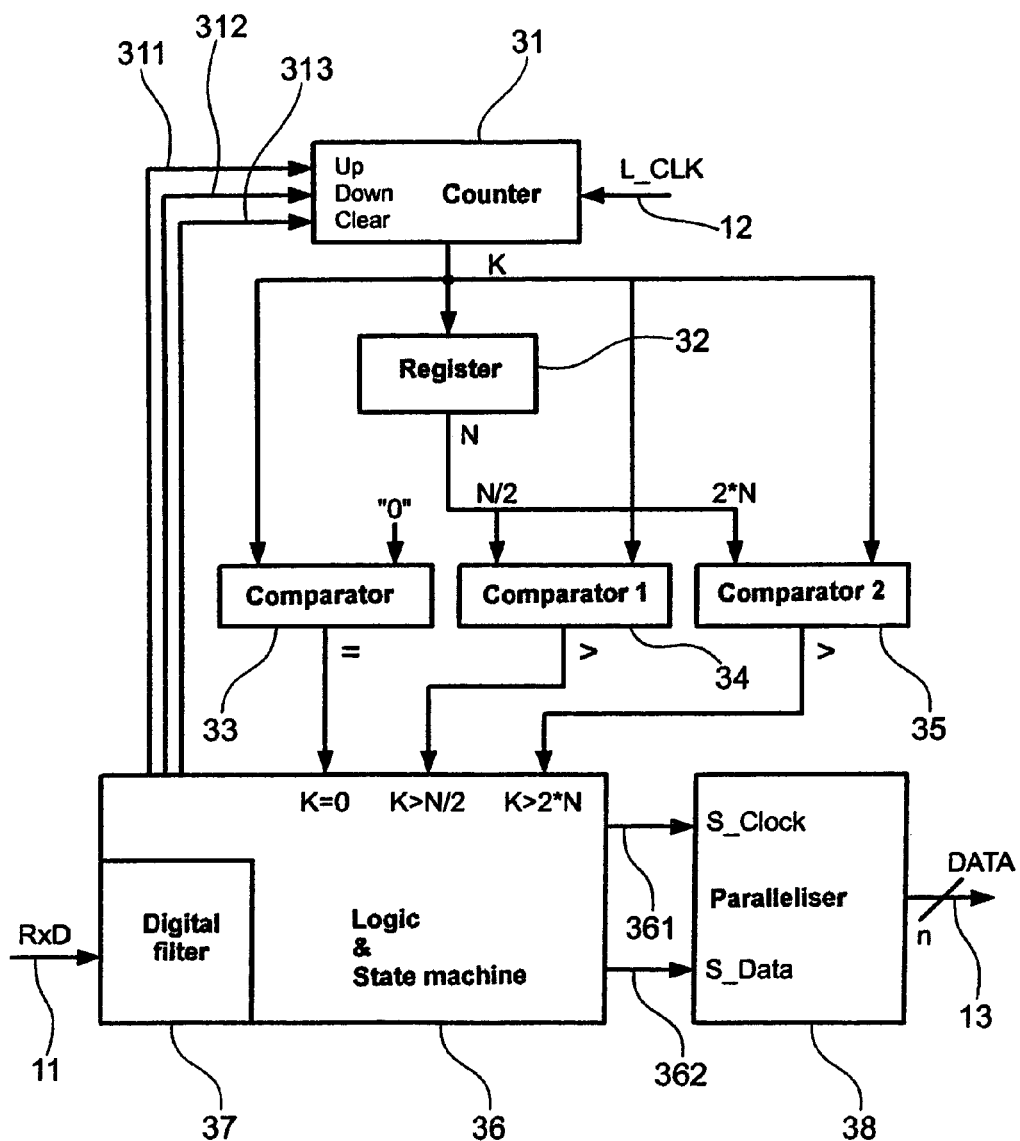
Figure 4:
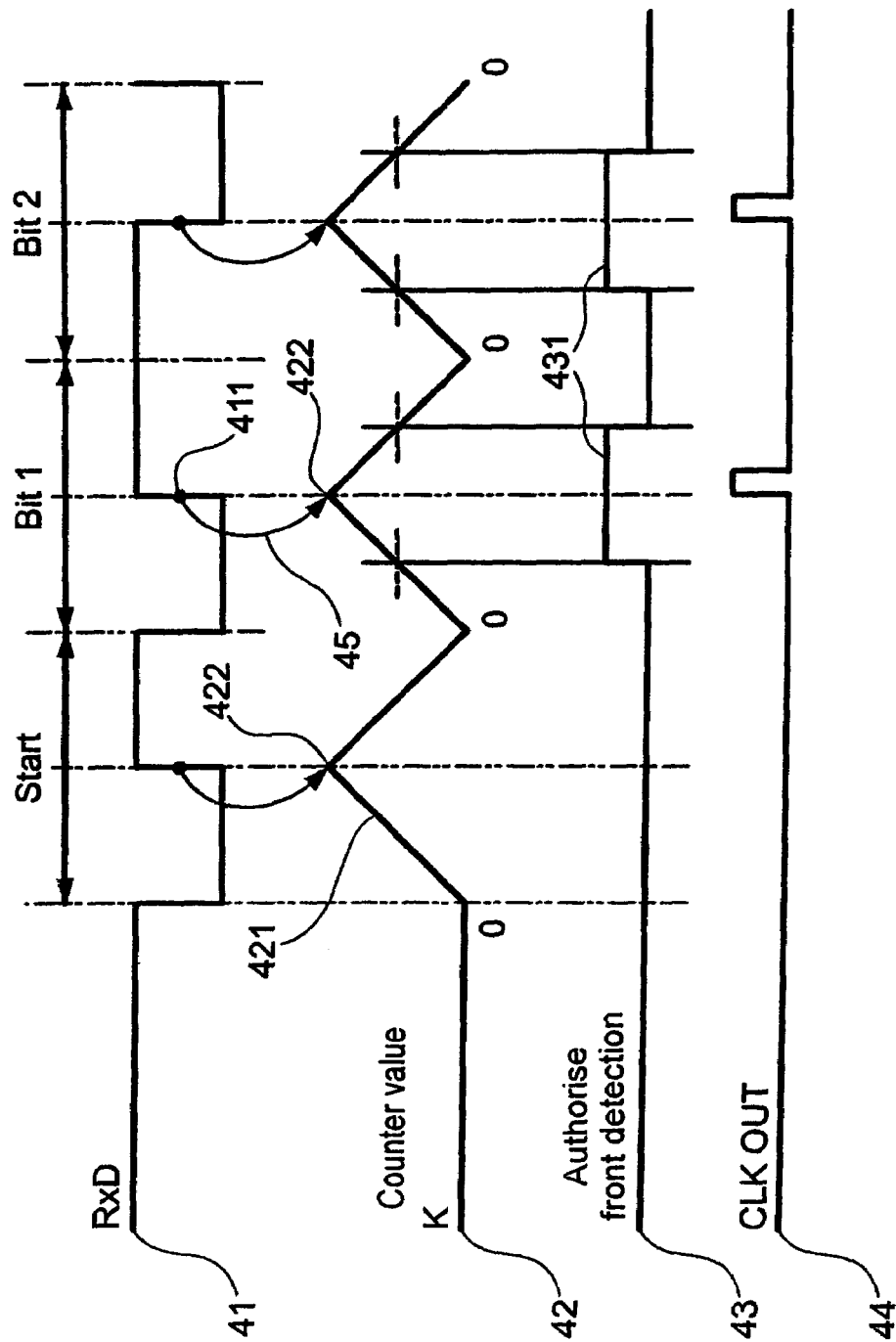

FIG. 3 describes operation of the decoder in FIG. 1, according to the invention, in the form of a block diagram;

FIG. 4 shows a time diagram of the different input/output signals and intermediate signals for the diagram in FIG. 3.

DESCRIPTION OF AN EMBODIMENT OF THE INVENTION

The general principle of the invention is based on an electronic circuit for decoding a two-phase asynchronous frame that retrieves transmitted data and their transmission clock at the output using a single counter without the need for an accurate internal clock or a phase locked loop.

In particular, this electronic circuit makes it possible to automatically adapt to an arbitrary and variable baud rate, even if it does not know the internal clock precisely. This can be done by using a sufficiently deep counter to adapt to a relatively low baud rate, and a sufficiently fast local clock to handle a higher baud rate.

According to the invention, it is considered that the data frame received at the decoder is of the asynchronous type since it is composed of a sequence of asynchronous binary elements of the receiver. It is also of the two-phase type since data bits are not encoded by states, but by transition bits. This coding technique is known under the name of Manchester encoding.

We will now describe inputs and outputs of decoder 14 with reference to FIG. 1.

This decoder 14 has two inputs, the first 11 on which the two-phase asynchronous frames are sent (denotes RxD in the figure) and the second 12 corresponding to the local clock input (L_CLK in the figure), also called the internal clock. In the embodiment described, the local clock may have an imprecise frequency, but more than 16 times the speed of the data to be decoded.

This decoder 14 also has an output 13 that is used to find the decoded data DATA put in parallel on a width of n bits, the number n varying depending on the application.

Figure 2:
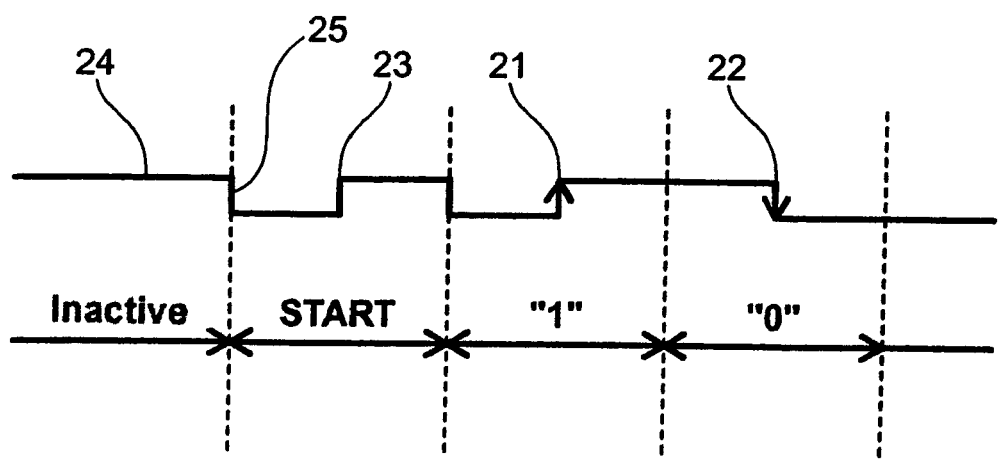
FIG. 2 illustrates a two-phase asynchronous data frame (Manchester) received by the decoder in FIG. 1.

In the embodiment described, the transmitted signal is organised in frames. The two-phase asynchronous frames received on the RxD input 11 of the decoder 14 are composed of a start bit, continue with data bits and terminate with one or several stop bits. These different bits are not encoded by states, but rather by transitions as illustrated in FIG. 2.

Thus, in the Manchester encoding, bits equal to "1" are encoded by rising fronts 21 (up direction) and bits equal to "0" are coded by falling fronts 22 (down direction). The start bit 23 is also encoded according to the Manchester principle.

Obviously, the invention presented is also applicable to any other type of coding in which bits are encoded by transitions and not by states. Thus, in another embodiment, bits equal to "1" could be encoded by falling fronts and bits equal to "0" could be encoded by rising fronts.

If there is no transmission, or between data, the decoder is in an inactive state 24, during which there are no transitions.

We will now present the block diagram of decoder 14 more precisely with reference to FIG. 3.

In a preferred embodiment, this decoder 14 is composed of:

a counter 31 that can be incremented or decremented;

a register 32 used to store the value of the counter 31 at a given instant;

a comparator 33, called the zero comparator, comparing the value of the counter 31 with zero;

two other comparators called first comparator 34 and second comparator 35;

a "Logic and State Machine" block 36;

a digital filter 37;

a paralleliser 38.

In order to improve decoding, it is desirable to put a digital filter 37 at the input to the circuit. This filter 37 will enable rejection of parasites (also called interferences), preventing the decoder 14 from confusing a parasite with a transition. To achieve this, several successive signal samples, for example three, can be taken into account: it could be decided whether or not they correspond to a transition (rising front or falling front) or a parasite, depending on the level of these three successive samples.

During the inactive state 24, the counter 31 is kept at the value zero. Therefore, the zero comparator 33 comparing the output from counter 31 with value zero is in the "true" position and its information is sent to the "Logic and State Machine" block 36. Nothing happens; the transmission line is in an inactive state. In this position, the counter 31 is equal to zero, under the action of a clear command 313.

During the first falling front 25, the counter 31 receives a command 311 from the "Logic and State Machine" block 36, starting an incrementation ("up" direction) until detection of a transition in the data signal. The value K of the counter 31 is then stored in the register 32 and the counter 31 starts again in the opposite direction; when the "Logic and State Machine" block 36 detects a transition, it sends a decrement command 312 (in the down direction).

When the zero comparator 33 detects that the counter 31 has reached the zero value, the counter 31 starts once again in the up direction, for example by applying the logic defined in the "Logic and State Machine" block 36.

At the time of the next transition, the new value of the counter 31 is memorized in the register 32 and counter 31 is once again decremented.

In this described preferred embodiment, the circuit also comprises two other comparators 34 and 35 to improve decoding performances.

The first comparator 34 compares the value of the counter 31 with the value N of register 32 divided by two. When the value of the counter 31 is greater than the value N of the register 32 divided by two (N/2), a window is created authorising detection of transitions in this window. This type of window covers about 50% of a binary time and is centred on the transition.

Therefore, the robustness of the system can be improved with this first comparator 34, since it reduces the probability of a false detection and prevents detection on inter-bit fronts when consecutive bits have the same value.

The second comparator 35 is used to compare the value of the counter 31 with the value N of the register 32 multiplied by two. This comparison is used to detect if transitions are still being received, and therefore if the transmission is not interrupted. This further improves the robustness of the decoder.

Finally, in this described embodiment, the "Logic and State Machine" block 36 will recover two signals, a decoding clock signal 361 and an intermediate decoded data signal 362, called S_Clock and S_Data on the block diagram.

This "Logic and State Machine" block 36 occurs at different steps during decoding; its role is to detect changes in fronts on the two-phase asynchronous data signal to be decoded, to count the number of bits received according to the application, and to manage the counter 31 and the register 32, taking account of the output from the three comparators 33, 34 and 35.

A final paralleliser block 38 is used to reconstruct the decoded DATA signal 13, composed of data decoded in parallel on a width of n bits, where the number n depends on the application.

FIG. 4 more easily displays the behaviour of the decoder 14, and more particularly of the counter 31. Some signals in the preferred embodiment described above are represented on this time diagram, as a function of a received two-phase asynchronous data frame 41 composed of a start bit and data bits, similar to the signal in FIG. 2.

The count value at the output from the counter 31 may be considered as a signal 42 of the sawtooth type 421. These sawteeth 421 are not necessarily regular since the cyclic ratio can be different from 50%.

There is a transition 411 at each peak 422 of the sawtooth signal (45), that transports the value of a bit on the data signal. The decoder as described will find the value of the bit and reconstitute a clock 44 to put data into parallel, by decoding the direction of the transition (up or down).

The third curve 43 shows the windows 431 determined using the first comparator 34. These windows 431 give authorisation to detect a front in the interval that they define. These predetermined intervals and the sawtooth signal 42 of the counter 31 are used to recover the decoding clock 361 (also represented by the fourth curve 44) and the decoded data.

In one particular embodiment, the electronic circuit according to the invention is also used to decode a non-fixed data sequence. As described above, the analysis of each window 431 informs us whether or not a transition is present in this window. If a series of M transitions is detected, the contents of the next window authorising detection of a front will be analysed; if there is no transition in this window, it may be considered that the last received bit (M bit) is a stop bit. Otherwise, we must wait to receive other data.

For example, assume that the decoder can receive several 16- or 17-bit frames, without knowing the order in which it will receive them in advance. In this case, the electronic decoding circuit will firstly decode the first 16 bits received as described above. Since the decoder does not know the exact number of data that it will receive, it continues to study the received sequence, after reception and decoding of the first 16 bits.

Therefore it will continue to analyse the contents of the new transition detection authorisation window created after reception of the first 16 bits. If the new window contains a transition, it will be considered that this transition corresponds to the 17th bit. Therefore, it is decided that a 17-bit frame has been received. However, if the contents of the new window are empty, it has to be considered that the last received transition corresponds to a stop bit and that consequently the received frame was composed of 16 bits.

Obviously, this particular embodiment is not restricted to 16- and 17-bit frames, and those skilled in the art could easily extend it to different frame lengths.

Therefore, the decoder according to the invention can be used to receive and process frames comprising a non-fixed number of data.

In general, the width of the counter and the register is given by the ratio between the baud rate of the data signal and the value of the local clock.

For example, with data at 1200 bauds and a local clock at 1 MHz, the count capacity must be greater than $10^6/2400$, namely 416, which defines a 9-bit counter. It is recommended that a 10-bit or more counter should be used in order to absorb tolerances on the data and local clock (for example ±10%) and to set up frame error detection.

In particular, this electronic decoding circuit may be used for decoding DALI type frames. Therefore, for example, it can be used in a lighting control device.

The invention claimed is:

1. An electronic circuit for decoding an asynchronous two-phase data signal, the circuit comprising:
    a logic block configured to receive a data signal, to detect transitions in the received data signal, and to generate a decoding clock, wherein each detected transition has a direction;
    a counter electrically coupled to the logic block, the counter fed by an internal clock, the counter configured to repeatedly increment until detection of a transition in the data signal, and to decrement down to zero when the transition in the data signal is detected; and
    a first comparator configured to receive output from the counter, the output being first divided by two, wherein predetermined intervals for detecting a transition are controlled by the first comparator and by the counter;
    wherein the decoding clock is generated based on contents of the counter.

2. The circuit according to claim 1, wherein the decoding clock is generated by taking into account peaks of a waveform representing the contents of the counter.

3. The circuit according to claim 2, wherein each of the peaks is used to mark a transition that transports the value of a bit of the data signal.

4. The circuit according to claim 3, wherein the direction of each of the transitions is analysed to decode a value of a bit of the data signal.

5. The circuit according to claim 1, further comprising at least one register configured to store the contents of the counter when the transition is detected in the data signal.

6. The circuit according to claim 1, further comprising an initializer, the initializer configured to activate incrementation of the counter during a first falling front of the data signal, the counter being forced to zero activating.

7. The circuit according to claim 1, further comprising windowing means configured to limit the detection of a transition on predetermined intervals.

8. The circuit according to claim 7, wherein each of the predetermined intervals covers approximately 50% of a binary time and is centred on the transitions.

9. The circuit according to claim 1, further comprising a detector configured to detect interruption of the data signal.

10. The circuit according to claim 9, wherein the interruption detector includes a second comparator fed by the output from the register multiplied by two, and the second comparator further fed by the counter.

11. The circuit according to claim 1, further comprising a parasite rejecter configured to reject parasites on the data signal.

12. The circuit according to claim 11, wherein the rejecter includes a digital filter fed by the data signal and controlled by the internal clock.

13. The circuit according to claim 1, wherein the internal clock has a frequency at least 16 times greater than the data signal rate.

14. The circuit according to claim 1, wherein the data signal is encoded using Manchester encoding.

15. The circuit according to claim 1, wherein the data signal is organised into successive frames, each frame beginning with a start bit.

16. The circuit according to claim 1, wherein the circuit is configured to receive and decode a sequence comprising an undefined number of data.

17. A method for decoding a two-phase asynchronous data frame,
    the method comprising:
    generating a decoding clock based on a counter fed by an internal clock;
    incrementing the counter repeatedly until detection of a transition in the data signal; and
    decrementing the counter down to zero when the transition in the data signal is detected;
    receiving output from the counter in a first comparator, the output being first divided by two, controlling predetermined intervals, for detecting a transition, by the first comparator and by the counter.

18. A control device of equipment,
    the control device comprising:
    an electronic circuit configured to decode a two-phase asynchronous data signal, the electronic circuit including:
    a logic block configured to receive a data signal, to detect transitions in the received data signal, and to generate a decoding clock;
    the counter configured to increment repeatedly until detection of a transition in the data signal, and to decrement down to zero when the transition in the data signal is detected; and
    further comprising a first comparator configured to receive output from the counter, the output being first divided by two, wherein predetermined intervals for detecting a transition are controlled by the first comparator and by the counter.

19. The control device according to claim 18, wherein the equipment is a lighting equipment.

20. An electronic circuit for decoding an asynchronous two-phase data signal, the circuit comprising:
    a logic block configured to receive a data signal, to detect transitions in the received data signal, and to generate a decoding clock, wherein each detected transition has a direction;
    a counter electrically coupled to the logic block, the counter fed by an internal clock, the counter configured to repeatedly increment until detection of a transition in the data signal, and to decrement down to zero when the transition in the data signal is detected;
    windowing means configured to limit detection of a transition on predetermined intervals;
    a first comparator configured to receive output from the counter, the output being first divided by two, the predetermined intervals being controlled by the first comparator and by the counter;
    wherein the decoding clock is generated based on contents of the counter.

* * * * *